(12) United States Patent
Wong

(10) Patent No.: US 7,705,655 B2
(45) Date of Patent: Apr. 27, 2010

(54) INPUT BUFFER CIRCUIT

(75) Inventor: Thomas S. Wong, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 153 days.

(21) Appl. No.: 11/523,362

(22) Filed: Sep. 18, 2006

(65) Prior Publication Data
US 2008/0068064 A1 Mar. 20, 2008

(51) Int. Cl.
*H03K 17/30* (2006.01)
(52) U.S. Cl. .................. 327/379; 327/108; 326/80
(58) Field of Classification Search ............ 327/108, 327/109, 112, 379; 330/258; 326/33, 83
See application file for complete search history.

(56) References Cited

U.S. PATENT DOCUMENTS

| | | | | | |
|---|---|---|---|---|---|
| 4,291,246 | A | * | 9/1981 | Martino et al. | 326/70 |
| 5,132,573 | A | * | 7/1992 | Tsuru et al. | 326/67 |
| 5,920,729 | A | * | 7/1999 | Barnett | 326/64 |
| 6,750,715 | B2 | * | 6/2004 | Allott et al. | 330/258 |
| 6,788,101 | B1 | * | 9/2004 | Rahman | 326/30 |
| 7,142,016 | B2 | * | 11/2006 | Kim | 326/82 |
| 2006/0250165 | A1 | * | 11/2006 | Carey | 327/65 |
| 2007/0208797 | A1 | * | 9/2007 | Turner | 708/800 |

* cited by examiner

*Primary Examiner*—Lincoln Donovan
*Assistant Examiner*—Colleen O'Toole
(74) *Attorney, Agent, or Firm*—Sawyer Law Group, P.C.

(57) ABSTRACT

An input buffer circuit. In one embodiment, the input buffer circuit includes a first transistor operable to receive a first input signal, a second transistor operable to receive a second input signal, and a first mechanism coupled to the first transistor and to the second transistor. The first mechanism is operable to control the first and second transistors such that the first and second transistors can receive either single-ended input signals or differential input signals. According to the embodiments disclosed herein, the input buffer combines single-ended input and differential input functionalities without compromising performance.

12 Claims, 3 Drawing Sheets

INPUT BUFFER CIRCUIT

FIELD OF THE INVENTION

The present invention relates to semiconductor devices, and more particularly to an input buffer circuit.

BACKGROUND OF THE INVENTION

Input buffer circuits are well known. Examples of input buffer circuits include single-ended input buffer circuits having transistor-transistor logic (TTL) architecture and differential input buffer circuits having emitter-coupled logic (ECL) or positive ECL (PECL) architecture. Conventional single-ended input buffer circuits and differential input buffer circuits require different designs due to the compatibility of signal levels. For example, the voltage levels of PECL and CML circuits are typically higher than the voltage levels of TTL circuits. Another example is that single-ended signals such as TTL require a switching threshold voltage while differential signals do not require any additional reference voltage.

One problem with existing systems is that differential signals such as PECL or CML are often mixed with single-ended signals such as TTL. Therefore, it is difficult to predict the interface required. Another problem is testing; a user may want to use a single-ended signal for testing while using differential signals during normal operation. One conventional solution is to utilize two different types of input buffer circuits. For example, a system can be designed having both a single-ended input buffer circuit and a differential input buffer circuit. The system would also include a multiplexor to select between the two input buffer circuit types. One problem with this approach is that it requires more space on the chip and requires additional external pins.

Accordingly, what is needed is an improved input buffer circuit that provides flexibility by enabling a user to choose optimal solutions for various applications. The present invention addresses such a need.

SUMMARY OF THE INVENTION

An input buffer circuit is disclosed. In one embodiment, the input buffer circuit includes a first transistor operable to receive a first input signal, a second transistor operable to receive a second input signal, and a first mechanism coupled to the first transistor and to the second transistor. The first mechanism is operable to control the first and second transistors such that the first and second transistors can receive either single-ended input signals or differential input signals. According to the embodiments disclosed herein, the input buffer combines single-ended input and differential input functionalities without compromising performance when the differential signals having a cross point voltage, also referred as common mode voltage, higher than or equal to the threshold voltage of single-ended signal. Cross point voltage, or common mode voltage, is the voltage at which the two differential signals (true and complement signals) cross each other during switching transitions.

DETAILED DESCRIPTION OF THE INVENTION

The present invention relates to semiconductor devices, and more particularly to an input buffer circuit. The following description is presented to enable one of ordinary skill in the art to make and use the invention, and is provided in the context of a patent application and its requirements. Various modifications to the preferred embodiment and the generic principles and features described herein will be readily apparent to those skilled in the art. Thus, the present invention is not intended to be limited to the embodiments shown, but is to be accorded the widest scope consistent with the principles and features described herein.

An input buffer circuit in accordance with the present invention is disclosed. The input buffer circuit includes input transistors that are operable to receive single-ended input signals or differential input signals. The input buffer circuit also includes a reference transistor that is operable to receive a reference voltage that is the threshold voltage for receiving single-ended input signal. Having the cross point voltage of the differential signal that is higher than the threshold voltage of the single-ended signal results in an input buffer circuit that combines single-ended input and differential input functionalities without compromising performance. In one embodiment, the input transistors are operable to provide the input buffer circuit with compatibility to multiple input signal levels for different functions such as for normal operations and for testing. To more particularly describe the features of the present invention, refer now to the following description in conjunction with the accompanying figures.

Although the present invention disclosed herein is described in the context of input buffer circuits, the present invention may apply to other types of circuits, and still remain within the spirit and scope of the present invention.

Figure 1:
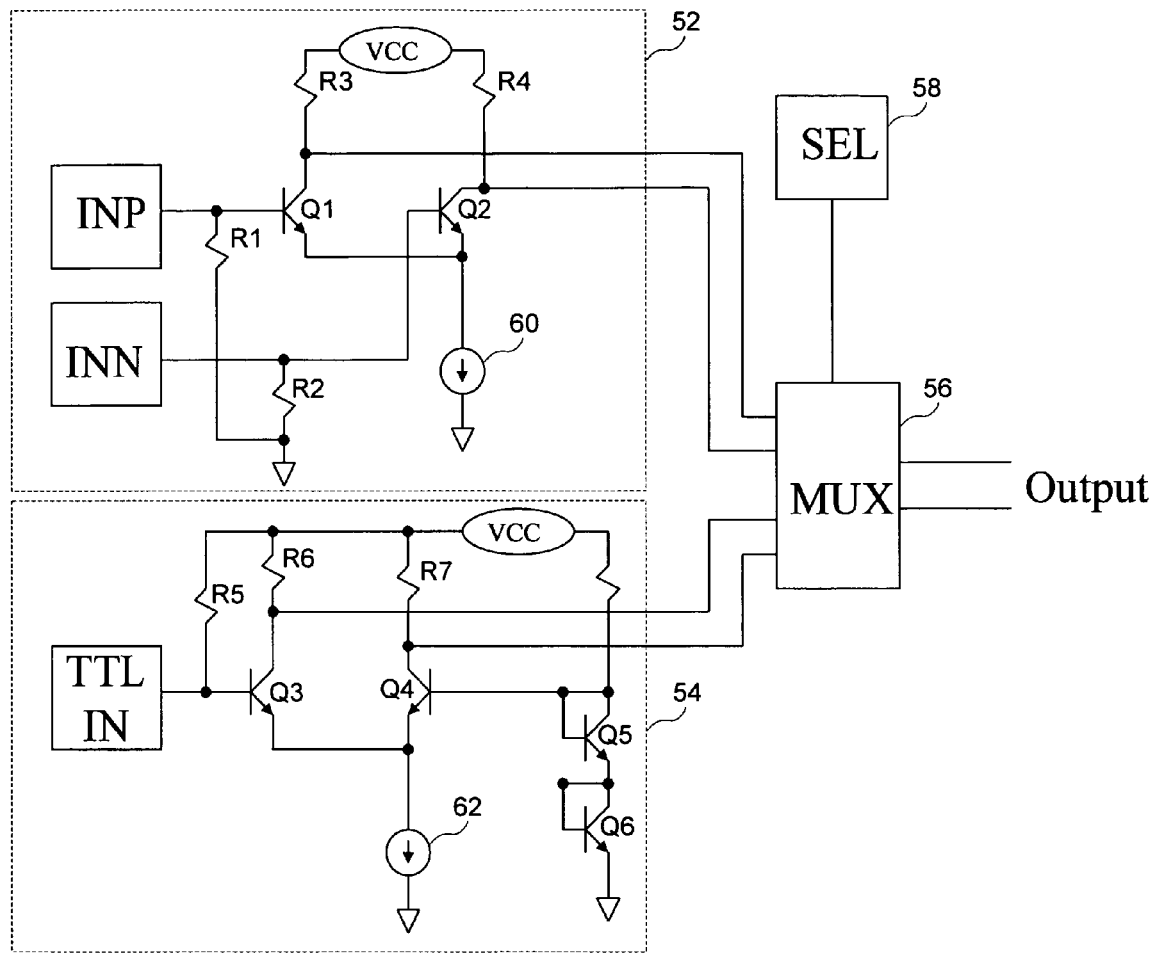
FIG. 1 is a block diagram of a conventional circuit that includes a differential input buffer circuit and a single-ended input buffer circuit.

FIG. 1 is a block diagram of a conventional circuit 50 that includes a differential input buffer circuit 52, a single-ended input buffer circuit 54, a multiplexor (mux) 56, and a select node 58. As FIG. 1 illustrates, the differential input buffer circuit 52 includes transistors Q1 and Q2; resistors R1, R2, R3, and R4; a voltage source VCC; and a current source 60. The single-ended input buffer circuit 54 includes transistors Q3, Q4, Q5, and Q6; resistors R5, R6, and R7, the voltage source VCC, and a current source 62.

In operation, generally, the selection node 58 is utilized to select either the differential input buffer circuit 52 or the single-ended input buffer circuit 54 via the mux 56. If the differential input buffer circuit 52 is selected, transistor Q1 is operable to receive a differential input signal via input node INP, and transistor Q2 is operable to receive a differential input signal via input node INN. If the single-ended input buffer circuit 54 is selected, transistor Q3 is operable to receive a single-ended input signal via input node TTL IN. Accordingly, mux 56 enables both types of input buffer circuits to be available.

As indicated above, one problem with this approach is that it requires more space and power on the chip because the system is designed with two separate input buffer circuits. However, this may be a desirable trade off since two different types of input buffer circuits are made available, even though only one input buffer circuit might be used at a given time. Another problem with this approach is that it requires one or more additional external pins per input buffer circuit. For example, two external pins INP and INN are required for the differential input buffer circuit, one external pin TTL IN is required for the single-ended input buffer circuit, and one external pin SEL is required to select the desired input buffer circuit.

Figure 2:
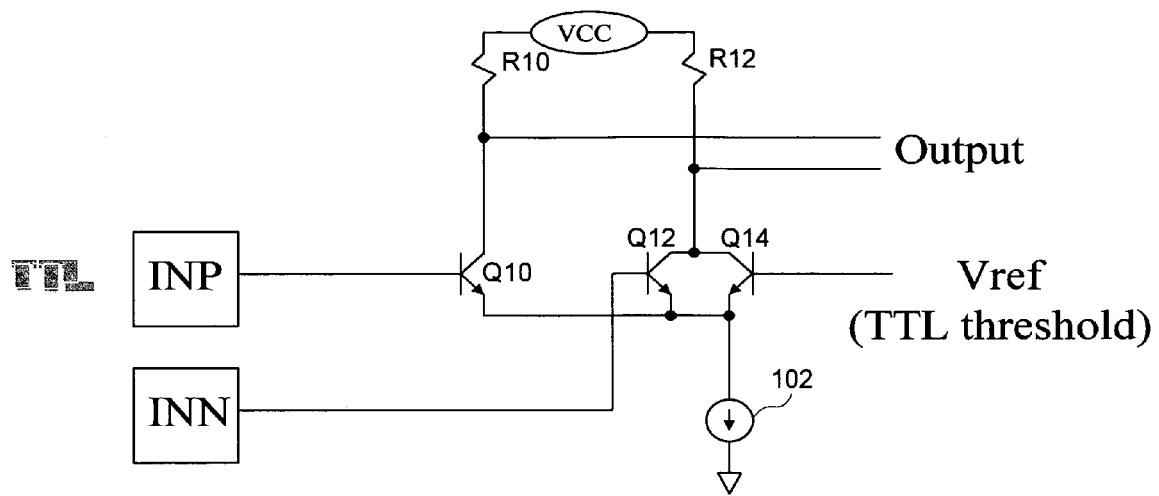
FIG. 2 is a block diagram of an input buffer circuit that includes elements that provide the functionality of both a single-ended input buffer circuit and a differential input buffer circuit in accordance with one embodiment of the present invention.

FIG. 2 is a block diagram of an input buffer circuit 100 that includes elements that provide the functionality of both a single-ended input buffer circuit and a differential input buffer circuit in accordance with one embodiment of the present invention. As FIG. 2 illustrates, the input buffer circuit 100 includes transistors Q10, Q12, and Q14; resistors R10 and R12; a voltage source VCC; and a current source 102.

In operation, transistors Q10 and Q12 are operable to selectively receive a single-ended input signal or differential input signals. For example, if the input buffer circuit 100 is operating in a single-ended input mode, transistor Q10 is operable, in conjunction with transistor Q14 and the reference voltage as the switching threshold voltage, to receive a single-ended input signal, and to drive their respective outputs accordingly. In this case, Q12 is turned off and not used. This is achieved through leaving Q12 unconnected or connected directly or indirectly to a voltage that is lower than the reference voltage, such as ground, and having the reference voltage be the threshold voltage. If the input buffer circuit 100 is operating in a differential input mode, both of the transistors Q10 and Q12 are operable to receive differential input signals and to drive their respective outputs accordingly. In this case, Q14 is turned off and not used. This is achieved through having the cross point, or the common mode voltage, of the differential signals higher than the reference voltage.

Figure 3:
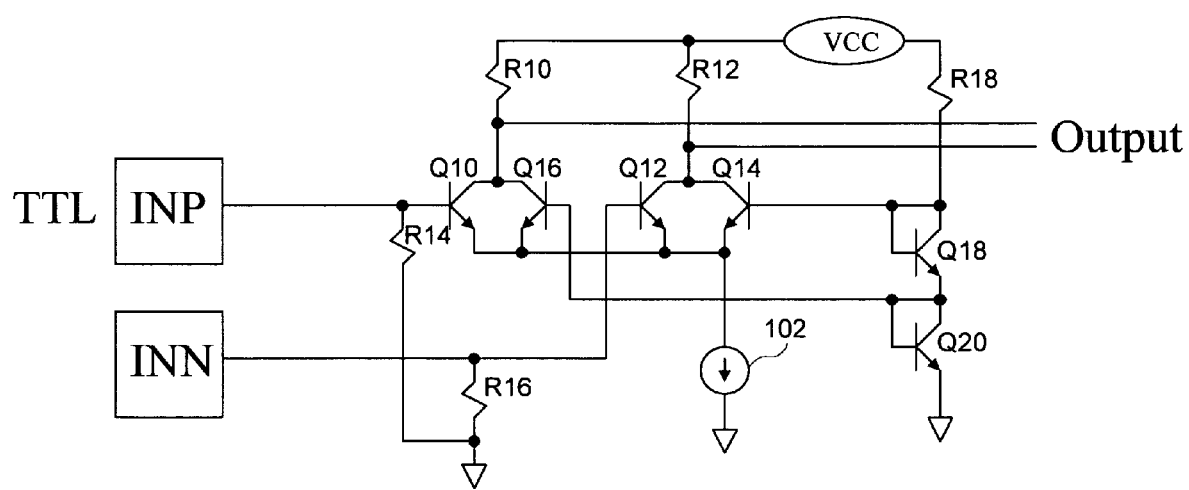
FIG. 3 is a block diagram of an input buffer circuit that includes elements that provide the functionality of both a single-ended input buffer circuit and a differential input buffer circuit in accordance with another embodiment of the present invention.

FIG. 3 is a block diagram of an input buffer circuit 200 that includes elements that provide the functionality of both a single-ended input buffer circuit and a differential input buffer circuit in accordance with another embodiment of the present invention. As FIG. 3 illustrates, the input buffer circuit 200 includes transistors Q10, Q12, Q14, Q16, Q18, and Q20; resistors R10, R12, R14, R16, and R18; a voltage source VCC; and a current source 102. For ease of illustration, like elements have like reference numbers to those of the input buffer circuit 100 of FIG. 2.

The input buffer circuit 200 of FIG. 3 operates similarly to the input buffer circuit 100 of FIG. 2. Transistors Q10 and Q12 are operable to selectively receive single-ended input signal or differential input signals. For example, if the input buffer circuit 200 is operating in a single-ended input mode, transistor Q10 is operable, in conjunction with transistor Q14 and the reference voltage as the switching threshold voltage, to receive single-ended input signal, and to drive their respective outputs accordingly. In this case, transistor Q12 is turned off and not used. This is achieved through leaving transistor Q12 unconnected or connected directly or indirectly to a voltage that is lower than the reference voltage, such as ground, and having the reference voltage be the threshold voltage. If the input buffer circuit 200 is operating in a differential input mode, both of the transistors Q10 and Q12 are operable to receive differential input signals and to drive their respective outputs accordingly. In this case, transistor Q14 is turned off and not used. This is achieved through having the cross point, or the common mode voltage, of the differential signals higher than the reference voltage. In one embodiment, the combination of the transistors Q18 and Q20 and the resistor R18 provide (i.e., set) the reference voltage. Although the present invention disclosed herein is described in the context of a reference voltage implemented with transistors Q18 and Q20, and resistor R18, the reference-voltage may be implemented with other combinations of elements including transistors, resistors, diodes, voltage regulators, etc., and still remain within the spirit and scope of the present invention.

In one embodiment, the resistors R14 and R16 couple to the transistors Q10 and Q12, respectively, and function as pull-down resistors for the inputs NP and INN, respectively, when either is not used. In one embodiment, the transistor Q16 functions as a balancing transistor to balance the load, similar to transistor Q12, to the two respective output nodes. Transistor Q16 remains off all the time.

Embodiments of the present invention, as examples, take advantage of the fact that PECL and CML cross point voltage levels are higher than TTL threshold voltages. In other words, differential cross point voltage levels are typically higher than single-ended threshold voltages. However, the present invention would work with different voltage levels and standards and is not limited only to the above mentioned voltage levels standards.

According to the circuit disclosed herein, the present invention provides numerous benefits. For example, embodiments of the present invention utilize the same elements to combine single-ended input and differential input functionalities. Embodiments of the present invention combine these single-ended input and differential input functionalities into one input buffer circuit without increasing power, size, complexity and number of external pins.

An input buffer circuit in accordance with the present invention has been disclosed. The input buffer circuit includes input transistors that are operable to receive single-ended input signals or differential input signals. The input buffer circuit also includes a reference transistor that is operable to receive a reference voltage that is the threshold voltage for receiving single-ended input signal. Having the cross point voltage of the differential signal that is higher than the threshold voltage of the single-ended signal results in an input buffer circuit that combines single-ended input and differential input functionalities without compromising performance.

The present invention has been described in accordance with the embodiments shown. One of ordinary skill in the art will readily recognize that there could be variations to the embodiments, and that any variations would be within the spirit and scope of the present invention. Accordingly, many modifications may be made by one of ordinary skill in the art without departing from the spirit and scope of the appended claims.

What is claimed is:

1. A circuit comprising:
an input buffer circuit comprising:
a first transistor having a base that is operable to receive a first input signal;
a second transistor having a base that is operable to receive a second input signal, and wherein the second transistor has an emitter that is coupled directly to an emitter of the first transistor; and
a third transistor having a base that is coupled to a first reference voltage, wherein the third transistor has an emitter that is directly coupled to the emitter of the first transistor and directly coupled to the emitter of the second transistor, wherein the third transistor has a collector that is directly coupled to a collector of the second transistor, wherein the third transistor is operable to control the first and second transistors, wherein the third transistor enables both the first transistor and the second transistor to receive single-ended input signals and differential input signals, wherein, when operating in a single-ended input mode, the first transistor is operable to receive a single-ended input signal and the second transistor is turned off, and wherein, when operating in a differential input mode, both of the first and second transistors are operable to receive differential input signals and the third transistor is turned off.

2. The circuit of claim 1 wherein the third transistor enables both the first transistor and the second transistor to receive single-ended input signals and differential input signals without a multiplexer.

3. The circuit of claim 1 further comprising a fourth transistor and a fifth transistor that are operable to provide the first reference voltage, wherein the fourth and fifth transistors control a switching threshold voltage of the input buffer circuit.

4. The circuit of claim 3 further comprising a sixth transistor operable to function as a balancing transistor, wherein the sixth transistor has an emitter that is coupled directly to the emitter of the first transistor and has a base that is coupled directly between the fourth and fifth transistors.

5. The circuit of claim 3 further comprising a sixth transistor operable to function as a balancing transistor, wherein the sixth transistor remains off due to having a base that remains at a voltage level that is always lower that a voltage level at the base of the third transistor.

6. The circuit of claim 3 further comprising a sixth transistor operable to function as a balancing transistor, wherein the sixth transistor has an emitter that is coupled directly to the emitter of the first transistor and has a base that is coupled directly between the fourth and fifth transistors, and wherein the sixth transistor remains off due to the base of the sixth transistor remaining at a voltage level that is always lower that a voltage level at the base of the third transistor.

7. The circuit of claim 1 wherein the first and second transistors are operable to provide the input buffer circuit with compatibility to multiple input signal levels for different functions.

8. A circuit comprising:
an input buffer circuit comprising:
    a first transistor having a base that is operable to receive a first input signal;
    a second transistor having a base that is operable to receive a second input signal, and wherein the second transistor has an emitter that is coupled directly to an emitter of the first transistor;
    a third transistor having a base that is coupled to a reference voltage, wherein the third transistor has an emitter that is directly coupled to the emitter of the first transistor and directly coupled to the emitter of the second transistor, wherein the third transistor has a collector that is directly coupled to a collector of the second transistor, wherein the third transistor is operable to control the first and second transistors, wherein the third transistor enables both the first transistor and the second transistor to receive single-ended input signals and differential input signals, wherein, when operating in a single-ended input mode, the first transistor is operable to receive a single-ended input signal and the second transistor is turned off, and wherein, when operating in a differential input mode, both of the first and second transistors are operable to receive differential input signals and the third transistor is turned off; and
    a plurality of elements operable to provide the reference voltage, wherein the reference voltage controls a switching threshold voltage of the input buffer circuit.

9. The circuit of claim 8 wherein the first and second transistors are operable to provide the input buffer circuit with compatibility to multiple input signal levels for different functions.

10. The circuit of claim 8 further comprising a balancing transistor.

11. The circuit of claim 10 wherein the balancing transistor remains off.

12. A circuit comprising:
an input buffer circuit comprising:
    a first transistor having a base that is operable to receive a first input signal;
    a second transistor having a base that is operable to receive a second input signal, and wherein the second transistor has an emitter that is coupled directly to an emitter of the first transistor; and
    a third transistor having a base that is coupled to a reference voltage, wherein the third transistor has an emitter that is directly coupled to the emitter of the first transistor and directly coupled to the emitter of the second transistor, wherein the third transistor has a collector that is directly coupled to a collector of the second transistor, wherein the third transistor is operable to receive a reference voltage that controls the switching threshold voltage of the input buffer circuit based on whether the first and second transistors are receiving single-ended input signals or differential input signals, wherein the third transistor enables both the first transistor and the second transistor to receive single-ended input signals and differential input signals, wherein, when operating in a single-ended input mode, the first transistor is operable to receive a single-ended input signal and the second transistor is turned off, and wherein, when operating in a differential input mode, both of the first and second transistors are operable to receive differential input signals and the third transistor is turned off.

* * * * *